US012660305B2

(12) United States Patent
Matsumura

(10) Patent No.: US 12,660,305 B2
(45) Date of Patent: Jun. 16, 2026

(54) REFERENCE VOLTAGE CIRCUIT

(71) Applicants:NEXPERIA B.V, Nijmegen (NL);
Nexperia Technology (Shanghai) Ltd.,
Shanghai (CN)

(72) Inventor: Yasuo Matsumura, Osaka (JP)

(73) Assignees: Nexperia B.V., Nijmegen (NL);
Nexperia Technology (Shanghai) Ltd.,
Shanghai (CN)

( * ) Notice: Subject to any disclaimer, the term of this
patent is extended or adjusted under 35
U.S.C. 154(b) by 0 days.

(21) Appl. No.: 18/614,096

(22) Filed: Mar. 22, 2024

(65) Prior Publication Data

US 2024/0321878 A1     Sep. 26, 2024

(30) Foreign Application Priority Data

Mar. 24, 2023     (EP) ..................................... 23164072

(51) Int. Cl.
| | |
|---|---|
| *H10D 84/84* | (2025.01) |
| *G05F 1/46* | (2006.01) |
| *G05F 3/24* | (2006.01) |
| *H10D 84/01* | (2025.01) |
| *H10D 84/03* | (2025.01) |
| *H10D 84/80* | (2025.01) |

(52) U.S. Cl.
CPC ............. *H10D 84/84* (2025.01); *G05F 1/468*
(2013.01); *G05F 3/242* (2013.01); *H10D*

*84/0163* (2025.01); *H10D 84/038* (2025.01);
*H10D 84/811* (2025.01)

(58) Field of Classification Search
CPC .. H10D 84/84; H10D 84/0163; H10D 84/038;
H10D 84/811; H10D 84/83; H10D 84/85;
H10D 84/0165; G05F 1/468; G05F 3/242;
G05F 1/567; G05F 1/10; G05F 3/245;
H05F 3/242; H03K 3/33; H03K
19/09443; H03K 19/09445; H03K
19/09482; H03K 19/09485
See application file for complete search history.

(56) References Cited

U.S. PATENT DOCUMENTS

| | | | |
|---|---|---|---|
| 4,978,904 A | 12/1990 | Fitzpatrick | |
| 8,049,483 B2 | 11/2011 | Yamamoto | |
| 10,401,891 B2 | 9/2019 | Sakaguchi | |
| 10,860,046 B2 | 12/2020 | Tsumura | |
| 2023/0135542 A1* | 5/2023 | Yasusaka ................ | G05F 3/242 |
| | | | 365/226 |

* cited by examiner

*Primary Examiner* — Jung Kim
(74) *Attorney, Agent, or Firm* — Ruggiero McAllister &
McMahon LLC

(57)     ABSTRACT

A reference voltage generating circuit is provided, including
a first depletion type metal-oxide semiconductor field-effect
transistor (MOSFET), a first enhancement type MOSFET, a
reference voltage output connected between the first deple-
tion type MOSFET and the first enhancement type MOS-
FET, and a second depletion type MOSFET.

14 Claims, 12 Drawing Sheets

FIG. 3        RELATED ART

REFERENCE VOLTAGE CIRCUIT

CROSS-REFERENCE TO RELATED APPLICATIONS

This application claims the benefit under 35 U.S.C. § 119(a) of European Patent Application No. 23164072.3 filed Mar. 24, 2023, the contents of which s are incorporated by reference herein in their entirety.

BACKGROUND

1. Field of the Disclosure

The present application relates to a reference voltage circuit, particularly but not exclusively, the application relates to a reference voltage circuit having an additional depletion type metal-oxide semiconductor field-effect transistor (MOSFET) configured to provide a current compensation.

2. Description of the Related Art

Voltage reference circuits are used to provide a fixed or constant voltage to a device, and are often used to reduce current consumption of a device. Low current consumption circuits are often implemented in the power supply of smaller, less power intensive devices, such as wearable electronics.

It is known to provide a voltage reference circuit including an enhancement type MOSFET and a depletion type MOSFET to provide a reference voltage, as shown in FIG. 1. Each MOSFET includes a source, drain and gate electrodes. N-channel (nMOS) and P-channel (pMOS) type MOSFETS also have a fourth terminal known as the substrate. In discrete MOSFETs the substrate is connected to the source terminal.

FIG. 2 shows a graph of the current through the depletion and enhancement MOSFETs, Id, against the voltage between the gate and source of each MOSFET, Vgs1 and Vgs2, in the circuit of FIG. 1. $V_{t\_DP}$ and $V_{t\_EN}$ represent the voltage through the depletion mode MOSFET and the enhancement mode MOSFET when the current through the device is zero.

The voltage between the gate and source of each MOSFET, Vgs1, Vgs2, and the reference voltage provided follow the below equations when Id=I1, in which L1 and W1 refer to the length and width of the MOS gate:

$$Vgs1 = \{I1 * (L_1 / W_1 * 2 / \beta_1)\}^{1/2} + V_{t\_DP} = K1 * I1^{1/2} + V_{t\_DP}$$

$$Vgs2 = \{I1 * (L_2 / W_2 * 2 / \beta_2)\}^{1/2} + V_{t\_EN} = K2 * I1^{1/2} + V_{t\_EN}$$

$$Vref = Vgs1 + Vgs2$$

$$Vgs1 = 0$$

$$Vref = Vgs2 = K2 * (Vgs1 - V_{t\_DP}) / K1 + V_{t\_EN}$$

The configuration of the circuit can be adjusted such that K2=K1. This is generally done by adjusting W and L, and can only be performed when designing or fabricating the MOSFETs. In general, they cannot be changed using circuit design.

$$Vref = (V_{t\_EN} - V_{t\_DP})$$

If the temperature coefficients of $V_{t\_EN}$ and $V_{t\_DP}$ were the same or substantially the same, then $$\Delta V_{t\_EN} / \Delta T \cong \Delta V_{t\_DP} / \Delta T,$$

and the temperature coefficient of the generated referenced voltage would be approximately zero, ΔVref/ΔT≈0.

However, it is generally found that the generated reference voltage, Vref, is dependent upon temperature and ΔVref/ΔT≠0, as demonstrated in FIG. 3 which shows a generated reference voltage, Vref, against the temperature of the circuit of FIG. 1. The change in generated reference voltage, Vref, due to the temperature is given as Δvref_t.

Δvref_t can be dependent upon the process characteristics of the fabrication process used to manufacture the depletion mode MOSFET and the enhancement mode MOSFET, but is generally found to vary by a few %. For low current consumption power supply, it is desirable to reduce Δvref_t to provide a more reliable and constant reference voltage.

It is known to introduce additional circuitry to provide a compensation to offset Δvref_t. However, the use of complicated, additional circuitry for this increase the current consumption of the reference voltage generating circuit.

SUMMARY

In general, the present disclosure proposes to overcome at least some of the above problems by providing a reference voltage circuit having an additional depletion type metal-oxide semiconductor field-effect transistor (MOSFET) configured to provide a current compensation.

For optimal performance of a reference voltage generating circuit, it is desired for Δvref_t to be less than 0.5%~0.75% of Vref. The present disclosure provides a voltage generating circuit that meets this criterion.

Aspects and preferred features are set out in the accompanying claims.

According to a first aspect of the disclosure, there is provided a reference voltage generating circuit comprising:

a first depletion type metal-oxide semiconductor field-effect transistor (MOSFET) having a source electrode, a drain electrode, and a gate electrode, and wherein the drain electrode of the first depletion type MOSFET is configured to be connected to a supply potential, and the gate electrode of the first depletion type MOSFET is connected to the source of the first depletion type MOSFET;

a first enhancement type MOSFET having a source electrode, a drain electrode, and a gate electrode, and wherein the drain electrode of the first enhancement type MOSFET is connected to the source electrode of the first depletion type MOSFET, the gate electrode of the first enhancement type MOSFET is connected to the drain of the first enhancement type MOSFET, and the source electrode of the first enhancement type MOSFET is connected to a first reference potential;

a reference voltage output connected between the source electrode of the first depletion type MOSFET and the drain electrode of the first enhancement type MOSFET; and a second depletion type MOSFET having a source electrode, a drain electrode, and a gate electrode, and wherein the drain electrode of the second depletion type MOSFET is connected between the supply potential and the drain electrode of the first depletion type MOSFET, and the source electrode of the second depletion type MOSFET is connected between the source electrode of the first depletion type MOSFET and the drain electrode of the first enhancement type MOSFET.

Each of the first depletion type MOSFET and the first enhancement type MOSFET may comprise a substrate electrode.

Each of the first depletion type MOSFET and the first enhancement type MOSFET may comprise N-channel MOSFETs. Alternatively, each of the first depletion type MOSFET and the first enhancement type MOSFET may comprise P-channel MOSFETS The reference voltage generating circuit may further comprise a first resistor connected between the source of the first depletion type MOSFET and the substrate of the first depletion type MOSFET, and a second resistor connected between the source of the first enhancement type MOSFET and the substrate of the first enhancement type MOSFET.

A ratio of a resistance of the first resistor and a resistance of the second resistor is configured such that a voltage of the reference voltage output decreases with increasing temperature.

The resistance of the first resistor may be less than the resistance of the second resistor The second depletion type MOSFET may comprise a substrate electrode.

The second depletion type MOSFET may comprise an N-channel MOSFET. Alternatively, the second depletion type MOSFET may comprise a P-channel MOSFET.

The reference voltage generating circuit may further comprise a third resistor connected between the source of the first depletion type MOSFET and the substrate of the second depletion type MOSFET.

The gate electrode of the second depletion type MOSFET may be connected to a second reference potential.

The first reference potential and the second reference potential may be the same reference potential.

The first reference potential and/or the second reference potential may be ground potential.

The gate of the second depletion type MOSFET may be connected to the source of the first enhancement type MOSFET.

The source of the second depletion type MOSFET may be connected between the drain of the first enhancement type MOSFET and the reference voltage output.

The reference voltage generating circuit may further comprise one or more additional first depletion type MOSFETs connected in series with the first depletion type MOSFET; and/or one or more additional first enhancement type MOSFETs connected in series with the first enhancement type MOSFET;

one or more additional second depletion type MOSFETs connected in parallel with the second depletion type MOSFET.

According to a further aspect of the disclosure, there is provided a method of manufacturing a reference voltage generating circuit, the method comprising:

forming a first depletion type metal-oxide semiconductor field-effect transistor (MOSFET) having a source electrode, a drain electrode, and a gate electrode, and wherein the drain electrode of the first depletion type MOSFET is configured to be connected to a supply potential, and the gate electrode of the first depletion type MOSFET is connected to the source of the first depletion type MOSFET;

forming a first enhancement type MOSFET having a source electrode, a drain electrode, and a gate electrode, and wherein the drain electrode of the first enhancement type MOSFET is connected to the source electrode of the first depletion type MOSFET, the gate electrode of the first enhancement type MOSFET is connected to the drain of the first enhancement type MOSFET, and the source electrode of the first enhancement type MOSFET is connected to a first reference potential;

forming a reference voltage output connected between the source electrode of the first depletion type MOSFET and the drain electrode of the first enhancement type MOSFET; and a second depletion type MOSFET having a source electrode, a drain electrode, and a gate electrode, and wherein the drain electrode of the second depletion type MOSFET is connected between the supply potential and the drain electrode of the first depletion type MOSFET, and the source electrode of the second depletion type MOSFET is connected between the source electrode of the first depletion type MOSFET and the drain electrode of the first enhancement type MOSFET.

The proposed device provides the following advantages:

The reference voltage generating circuit provides a reference voltage that has a reduced temperature coefficient compared to state-of-the-art reference voltage generating circuits;

The reference voltage generating circuit is simplifier than state-of-the-art devices, with only an additional depletion mode MOSFET and a resistor, whilst still providing a reduced $\Delta$vref_t;

The current consumption of the additional components of the circuit is reduced compared to alternative reference voltage generating circuits;

There is only a small increase of current consumption due to the additional components because the compensation provided is effective at high temperature;

The compensation of the reference voltage generating circuit may be realized by a direct power source and an additional current with a positive temperature coefficient to reference voltage.

BRIEF DESCRIPTION OF THE DRAWINGS

Some embodiments of the disclosure will now be described, by way of example only and with reference to the accompanying drawings, in which.

DETAILED DESCRIPTION

Figure 4:
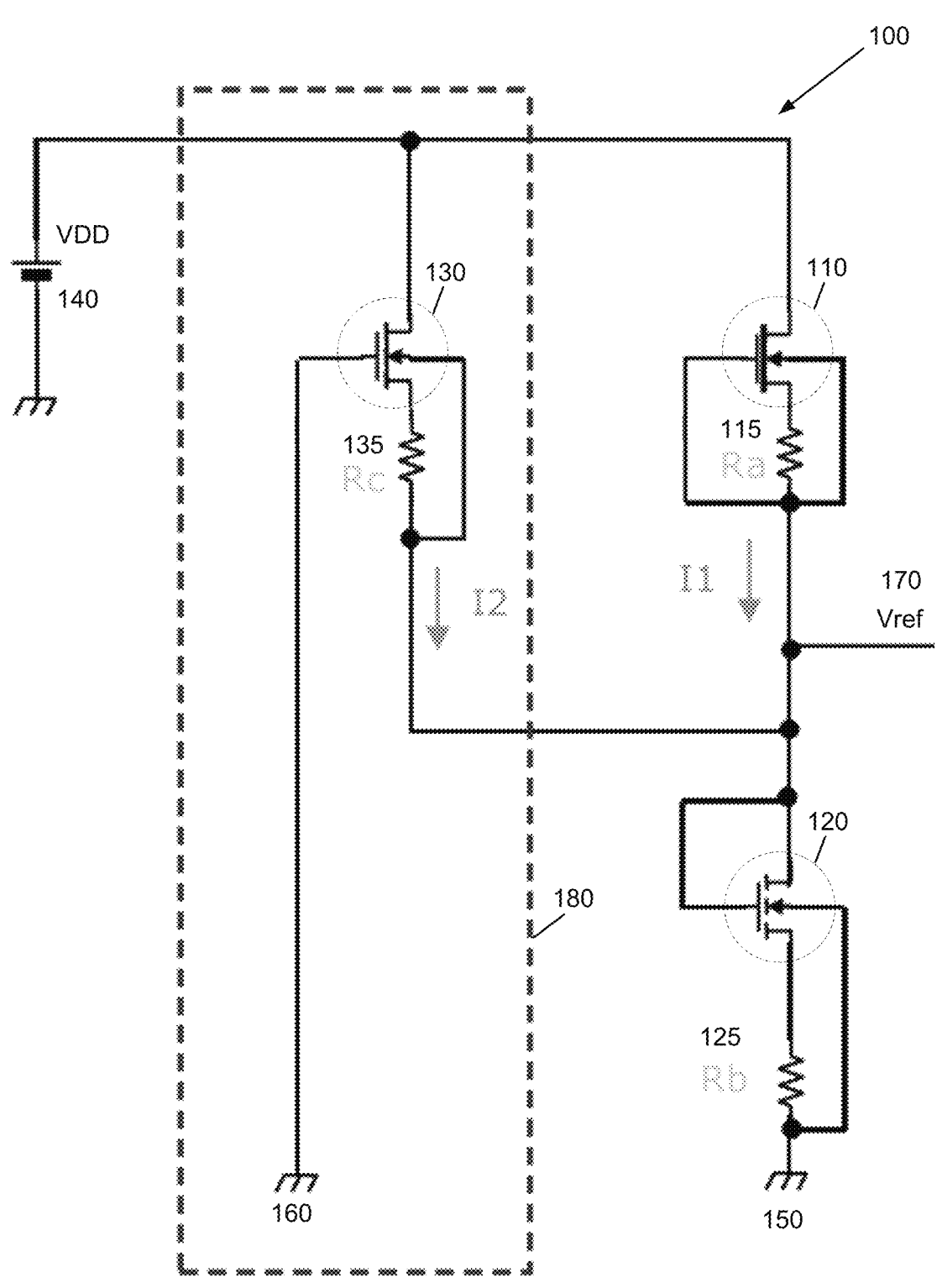
FIG. 4 illustrates schematically a circuit for providing a reference voltage according to an embodiment of the disclosure.

FIG. 4 illustrates a circuit 100 or module for providing a reference voltage according to an embodiment of the disclosure. The circuit 100 includes a first depletion-mode (also referred to as a normally-on), n-type metal-oxide semiconductor field-effect transistor (nMOSFET) 110. The first depletion-mode nMOSFET 110 has a source electrode, a drain electrode, a gate electrode, and a substrate electrode. The gate of the first depletion-mode nMOSFET 110 is connected to the source of the first depletion-mode nMOSFET 110 at a first node. A voltage measured between the gate and the source of the first depletion-mode nMOSFET 110 is given as Vgs1. The drain electrode of the first depletion-mode nMOSFET 110 is connected to a power source 140. In this example, the power source is a voltage cell or battery. The power source 140 provides a voltage VDD.

The substrate electrode of the first depletion-mode nMOSFET 110 is also connected to the source of the first depletion-mode nMOSFET 110. In this example, the substrate electrode of the first depletion-mode nMOSFET 110 is also connected to the source of the first depletion-mode nMOSFET 110 at the first node. Alternatively, the substrate electrode of the first depletion-mode nMOSFET 110 may be connected to a reference potential, such as ground potential. A first resistor 115 having a resistance Ra is connected to the source electrode of the first depletion-mode nMOSFET 110. The first resistor 115 is formed between the source electrode of the first depletion-mode nMOSFET 110 and the first node where both the gate and the substrate electrode of the first depletion-mode nMOSFET 110 are connected to the source electrode of the first depletion-mode nMOSFET 110.

A first enhancement-mode (also referred to as a normally-off) nMOSFET 120 is connected in series with the first depletion-mode nMOSFET 110. The first enhancement-mode nMOSFET 120 has a source electrode, a drain electrode, a gate electrode, and a substrate electrode. The drain electrode of the first enhancement-mode nMOSFET 120 is connected to the source electrode of the first depletion-mode nMOSFET 110. The gate electrode of the first enhancement-mode nMOSFET 120 is connected to the drain electrode of the first enhancement-mode nMOSFET 120 at a second node. Both the first and second nodes are formed between the first depletion-mode nMOSFET 110 and the first enhancement-mode nMOSFET 120.

The source electrode of the first enhancement-mode nMOSFET 120 is connected to a first reference potential 150. In this example, the first reference potential 150 is a ground potential. A voltage between the gate and the source of the first enhancement-mode nMOSFET 120 is given as Vgs2. The substrate electrode of the first enhancement-mode nMOSFET 120 is connected to the source electrode of the first enhancement-mode nMOSFET 120 at a third node. The third node is formed between the source electrode of the first enhancement-mode nMOSFET 120 and the first reference potential 150.

Figure 1:
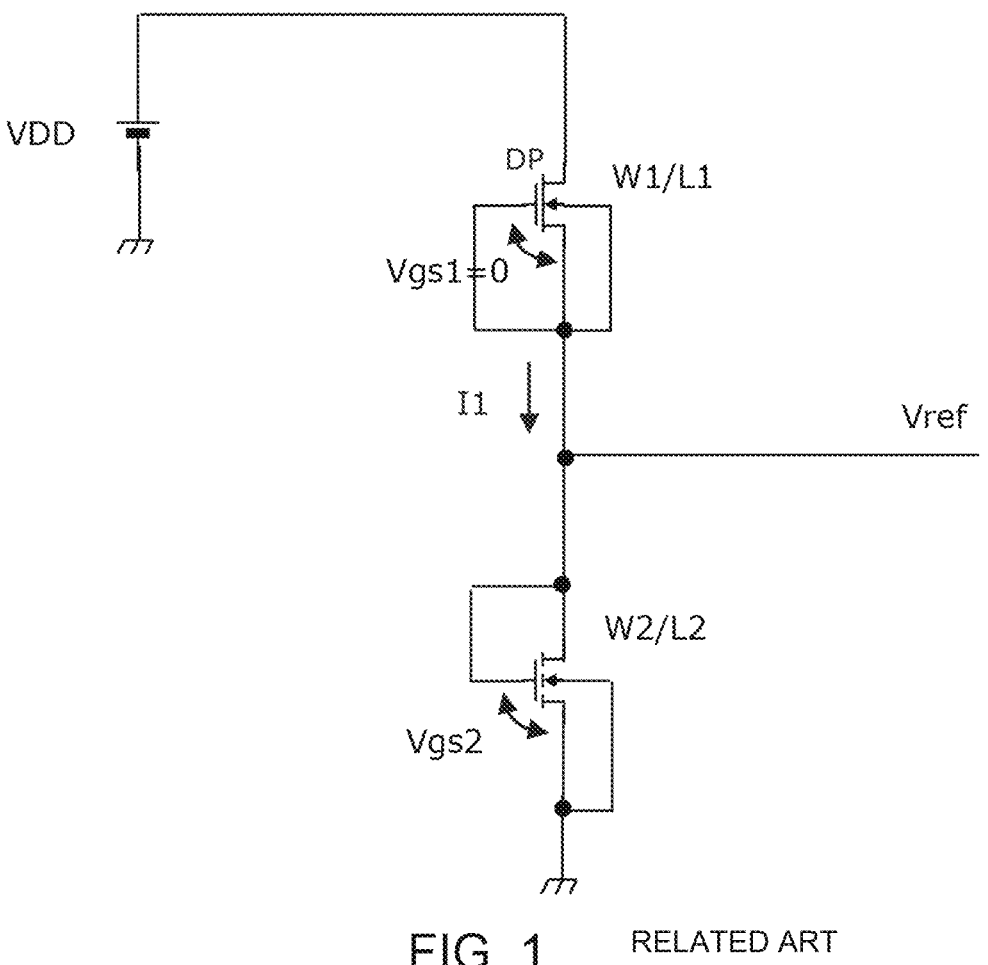
FIG. 1 illustrates schematically an example circuit for providing a reference voltage according to the state-of-the-art.
Figure 2:
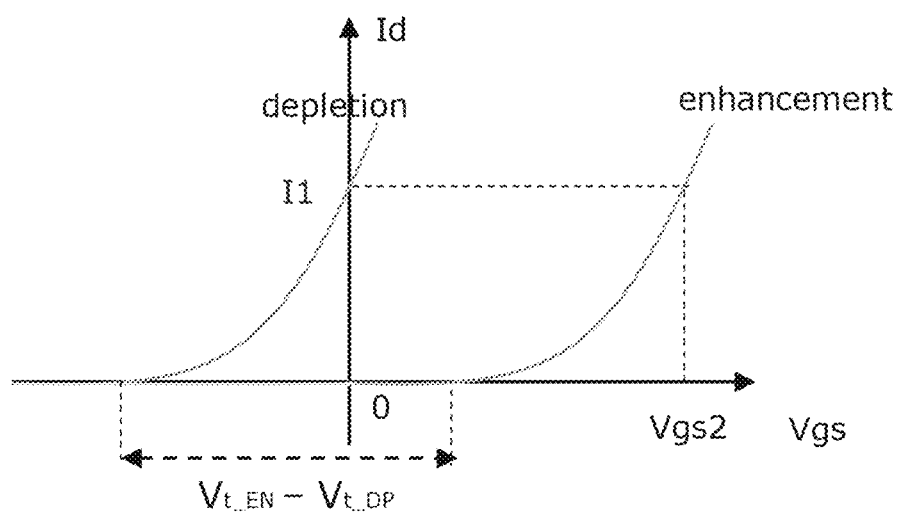
FIG. 2 shows a graph of the current against the voltage for a pair of depletion and enhancement MOSFETs in an example circuit for providing a reference voltage according to the state-of-the-art.
Figure 3:
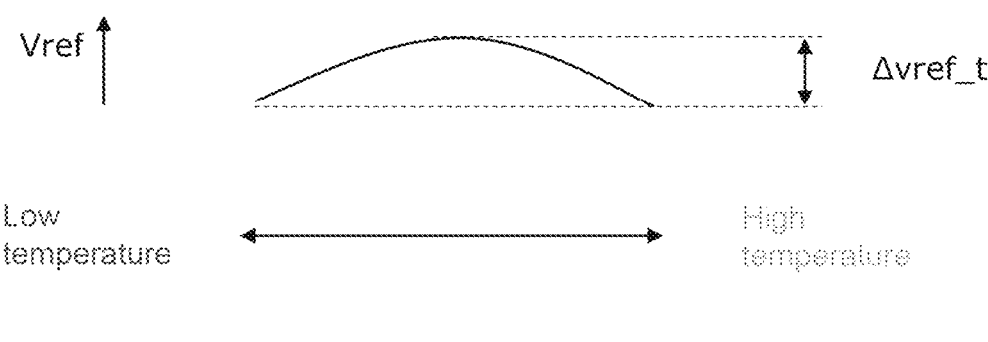
FIG. 3 shows a graph of the generated reference voltage against temperature of an example circuit for providing a reference voltage according to the state-of-the-art.

A second resistor 125 having a resistance Rb is connected to the source electrode of the first enhancement-mode nMOSFET 120. The second resistor 125 is formed between the source electrode of the first enhancement-mode nMOSFET 120 and the third node. As shown in FIG. 2, for a reference voltage generating circuit having a depletion mode MOSFET and an enhancement mode MOSFET connected in series, the voltage, Vgs1, between the gate and the source of the first depletion-mode nMOSFET 110 and the voltage, Vgs2, between the gate and the source of the first enhancement-mode nMOSFET 120 are similarly dependent on the current through them, I1. Consequently, the inclusion of the first and second resistors reduces the current, I1, whilst maintaining the reference voltage generated, Vref.

An output 170 for the generated reference voltage Vref is connected between the first depletion-mode nMOSFET 110 and the first enhancement-mode nMOSFET 120. In this example, the output 170 is connected to a fourth node located between the first node and the second node.

The circuit 100 includes additional circuitry 180, the additional circuitry 180 including a second depletion-mode nMOSFET 130 connected in parallel with the first depletion-mode nMOSFET 110. The second depletion-mode nMOSFET 130 has a source electrode, a drain electrode, a gate electrode, and a substrate electrode. The drain electrode of the second depletion-mode nMOSFET 130 is connected to the drain electrode of the first depletion-mode nMOSFET 110 and is connected to the power source 140. The drain electrode of the second depletion-mode nMOSFET 130 is connected to a fifth node located between the drain electrode of the first depletion-mode nMOSFET 110 and the power source 140.

The gate of the second depletion-mode nMOSFET 130 is connected to a second reference potential 160. In this example, the second reference potential 160 is a ground potential.

The source electrode of the second depletion-mode nMOSFET 130 is connected to the source electrode of the first depletion-mode nMOSFET 110 and to the drain electrode of the first enhancement-mode nMOSFET 120. The source electrode of the second depletion-mode nMOSFET 130 is connected to a sixth node located between the second node and the fourth node. A voltage measured between the gate and the source of the second depletion-mode nMOS-FET 110 is given as Vgs3.

The substrate electrode of the second depletion-mode nMOSFET 130 is connected to the source electrode of the second depletion-mode nMOSFET 130 at a seventh node. The seventh node is formed between the source electrode of the second depletion-mode nMOSFET 130 and the sixth node. A third resistor 135 having a resistance Rc is connected to the source electrode of the second depletion-mode nMOSFET 130. The third resistor 135 is formed between the source electrode of the second depletion-mode nMOSFET 130 and the seventh node.

The current through the first depletion-mode nMOSFET 110 and the first enhancement-mode nMOSFET 120 is given as I1. The current through the second depletion-mode nMOSFET 130 is given as I2.

Figure 5:
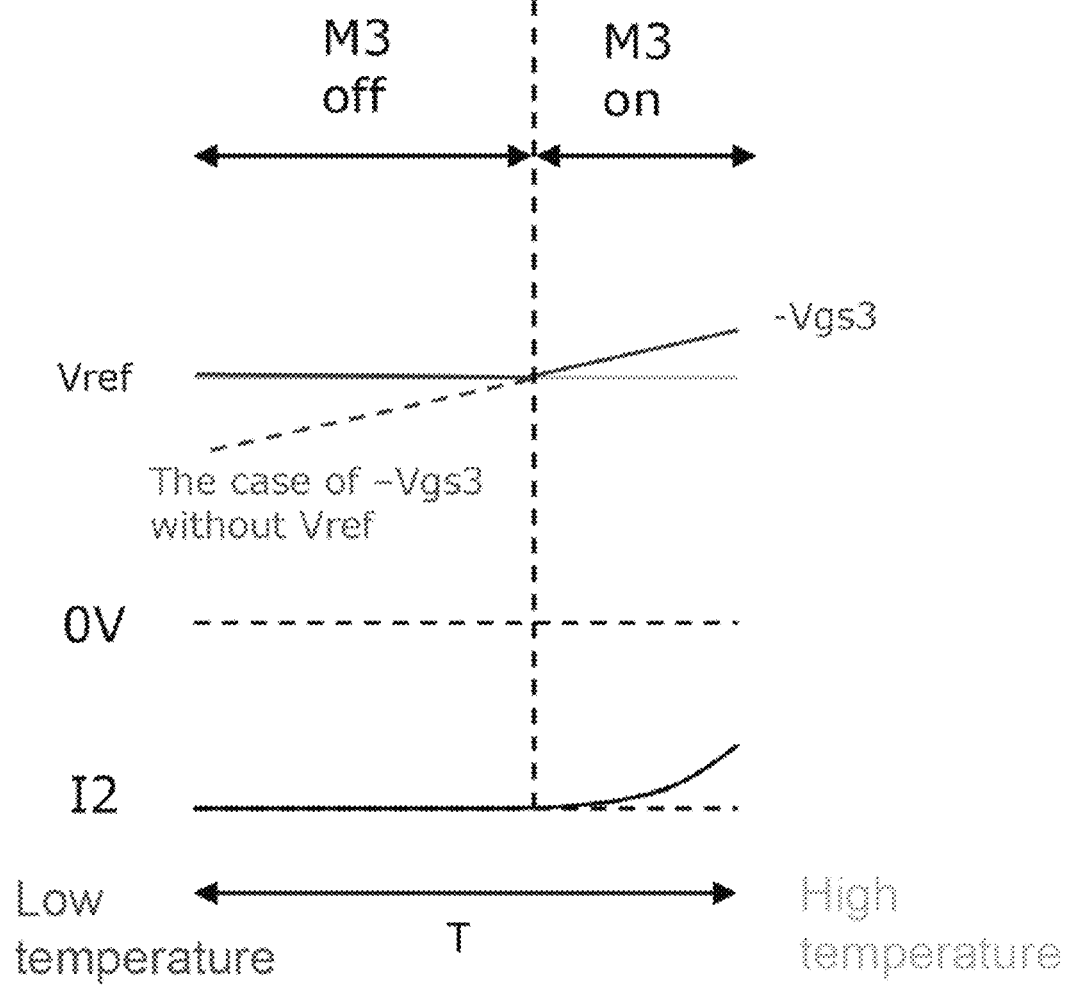
FIG. 5 shows graphs of current provided by an additional depletion type MOSFET, the voltage across the additional depletion type MOSFET, and a generated reference voltage against temperature of the circuit of FIG. 4.

The upper portion of FIG. 5 shows the voltage across the second depletion-mode MOSFET 130, Vgs3, and the generated reference voltage, Vref, against temperature of the circuit 100 of FIG. 4, when the second depletion-mode MOSFET 130, herein referred to as M3, is off at lower temperatures and when M3 is on at higher temperatures. If Vref>−Vgs3: then M3 is off, and if Vref<−Vgs3: then M3 is on, and the current I2 is generated. The dashed line illustrates the voltage of −Vgs3 in a situation where there is no Vref connection to the circuit. Vgs3 is the voltage measured between the gate and the source of the second depletion-mode nMOSFET 110. As the source node has a higher voltage than that of the gate node, Vgs3 is a negative value.

Figure 6:
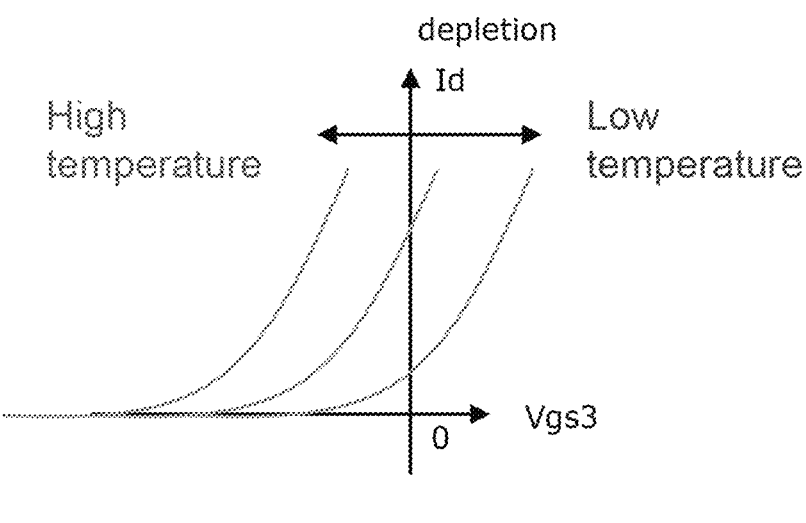
FIG. 6 shows a graph of the current against the voltage of an additional depletion type MOSFET of a circuit for providing a reference voltage according to an embodiment of the disclosure.

The lower portion of FIG. 5 shows the compensation provided to the generated reference voltage due to the second depletion-mode MOSFET 130 and the current, I2, through the second depletion-mode MOSFET 130. If Vref>−Vgs3: then M3 is off current is not generated by the resistor, and if Vref<−Vgs3: then M3 is on, and the current I2 is generated by the resistor. FIG. 6 shows a graph of the current, I2, against the voltage, Vgs3, of the second depletion-mode MOSFET 130 of the circuit of FIG. 4 for three different temperatures.

Figure 7:
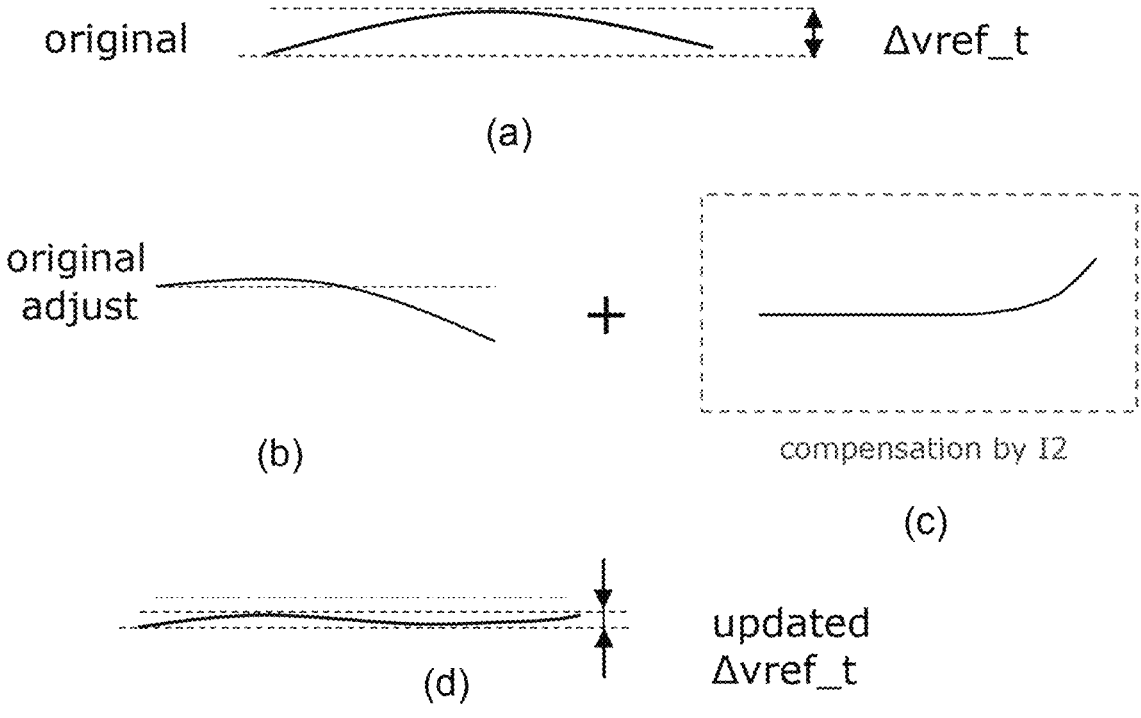
FIG. 7 shows a graph of the generated reference voltage against temperature of a circuit for providing a reference voltage according to an embodiment of the disclosure.

FIG. 7 shows the generated reference voltage against temperature, including the compensation provided by a second depletion-mode MOSFET as shown in FIG. 4.

FIG. 7(a) shows the generated reference voltage against temperature for a reference voltage generating circuit without a second depletion-mode MOSFET 130 to introduce compensation. The change in generated reference voltage, Vref, due to the temperature is given as Δvref_t;

FIG. 7(b) shows an adjusted generated reference voltage against temperature, similar to the reference voltage shown in FIG. 7(a). The magnitude of Δvref_t is not changed by this adjustment, however the change in reference voltage due to temperature, Δvref_t, does occur less at lower temperatures and more at higher temperatures. This adjustment is provided by selecting values of Ra and Rb, and K1 and K2 to provide the adjustment. In general, if Rb/Ra<1, then Δvref_t will be adjusted as shown in FIG. 7(b);

FIG. 7(c) shows the compensation provided to the reference voltage by I2 and the second depletion-mode MOSFET 130. The compensation increases Vref at higher temperatures; and FIG. 7(d) shows the resulting Vref from adding the adjusted Vref of FIG. 7(b) to the compensating voltage of FIG. 7(c). As the adjusted Vref of FIG. 7(b) has a decreasing Vref at higher temperatures, and the compensating voltage of FIG. 7(c) has an increasing voltage at higher temperatures, the magnitude of the resulting Δvref_t shown in FIG. 7(d) is significantly reduced.

Figure 8:
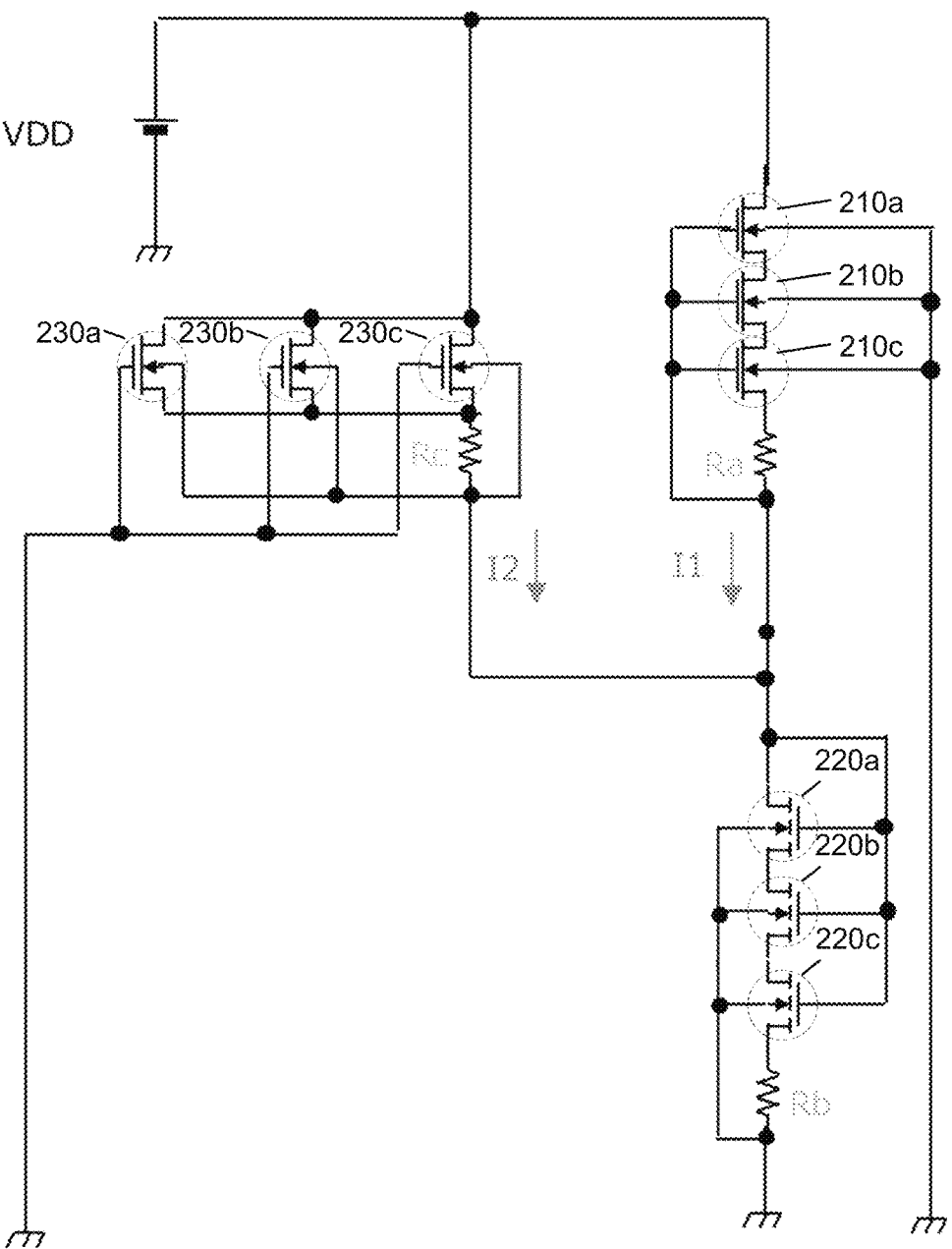
FIG. 8 illustrates schematically an alternative circuit for providing a reference voltage according to an embodiment of the disclosure.

FIG. 8 illustrates schematically an alternative circuit for providing a reference voltage according to an embodiment of the disclosure. This is similar to the circuit shown in FIG. 4, and therefore has similar reference numerals. However, in this embodiment, three first depletion-mode MOSFETS 210a, 210b, 210c, are connected in series in place of the one first depletion-mode MOSFET 110 shown in FIG. 4, three first enhancement-mode MOSFETS 220a, 220b, 220c, are connected in series in place of the one first enhancement-mode MOSFET 120 shown in FIG. 4, and three second depletion-mode MOSFETS 230a, 230b, 230c, are connected in parallel in place of the one second depletion-mode MOSFET 130 shown in FIG. 4. Although the first depletion-mode MOSFETS 210a, 210b, 210c and the enhancement-mode MOSFETS 220a, 220b, 220c are connected in series in the example shown, they may instead be connected in parallel. Similarly, although the second depletion-mode MOSFETS 230a, 230b, 230c are connected in parallel in the example shown, they may instead be connected in series.

Figure 9:
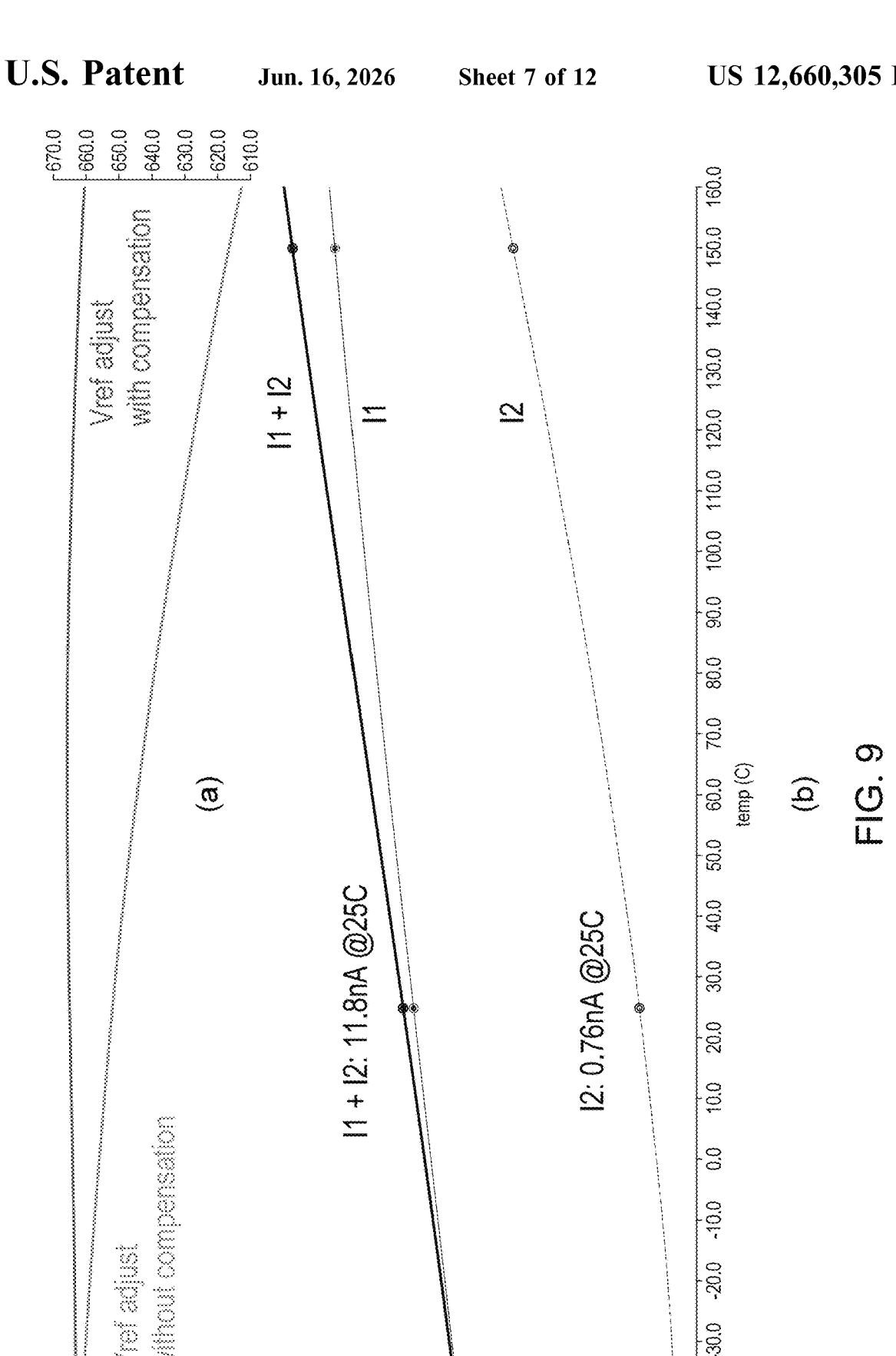
FIG. 9 shows both a graph of simulated values of generated reference voltage against temperature and of current against temperature in the circuit of FIG. 8.

FIG. 9(a) shows simulated values of generated reference voltage against temperature for the circuit of FIG. 8. The top line shows Vref against temperature when compensation is provided, and the lower line shows Vref against temperature when compensation is not provided.

FIG. 9(b) shows simulated values of current against temperature for the circuit of FIG. 8. The lower line shows the combined current, I2, from the second depletion-mode MOSFETS 230a, 230b, 230c. The middle line shows the current, I1, through the first depletion-mode MOSFETS 210a, 210b, 210c and the first enhancement-mode MOSFETS 220a, 220b, 220c, and the top line shows the total current consumption of the circuit, I1+I2.

Figure 10:
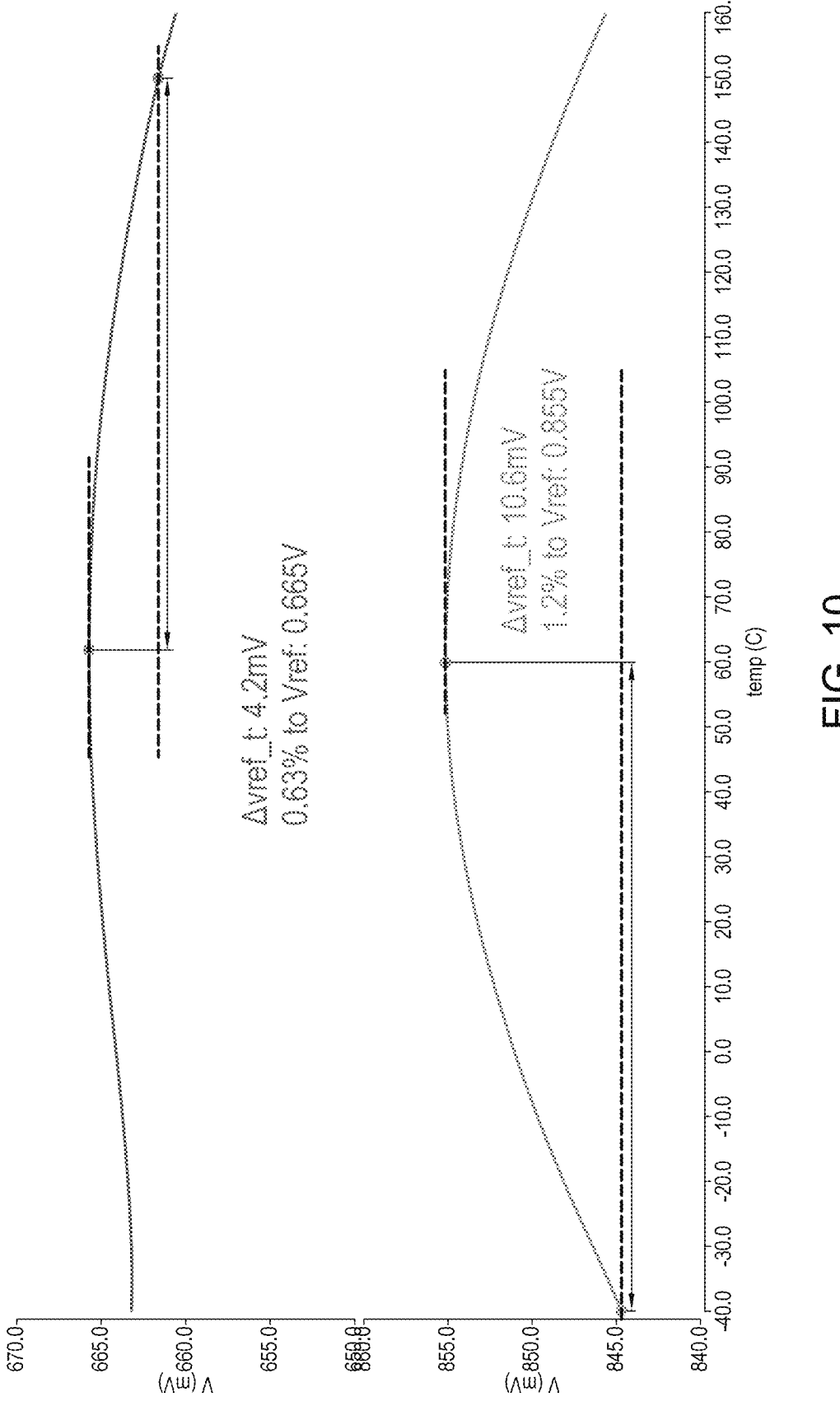
FIG. 10 shows a graph of simulated values of generated reference voltage against temperature of the circuit of FIG. 8.

FIG. 10 shows simulated values of generated reference voltage against temperature of the circuit of FIG. 8, compared to a circuit with no compensation, where the top graph shows simulated values of generated reference voltage against temperature of the circuit of FIG. 8, and the lower graph of FIG. 10 shows generated reference voltage of a circuit with no compensation. This shows the reduced magnitude of Δvref_t due to the compensation, and also the reduced value of Δvref_t as a fraction of Vref itself. This illustrates the improved accuracy and reliability, and reduced variability of Vref as a result of the compensation.

Figures 11, 12:
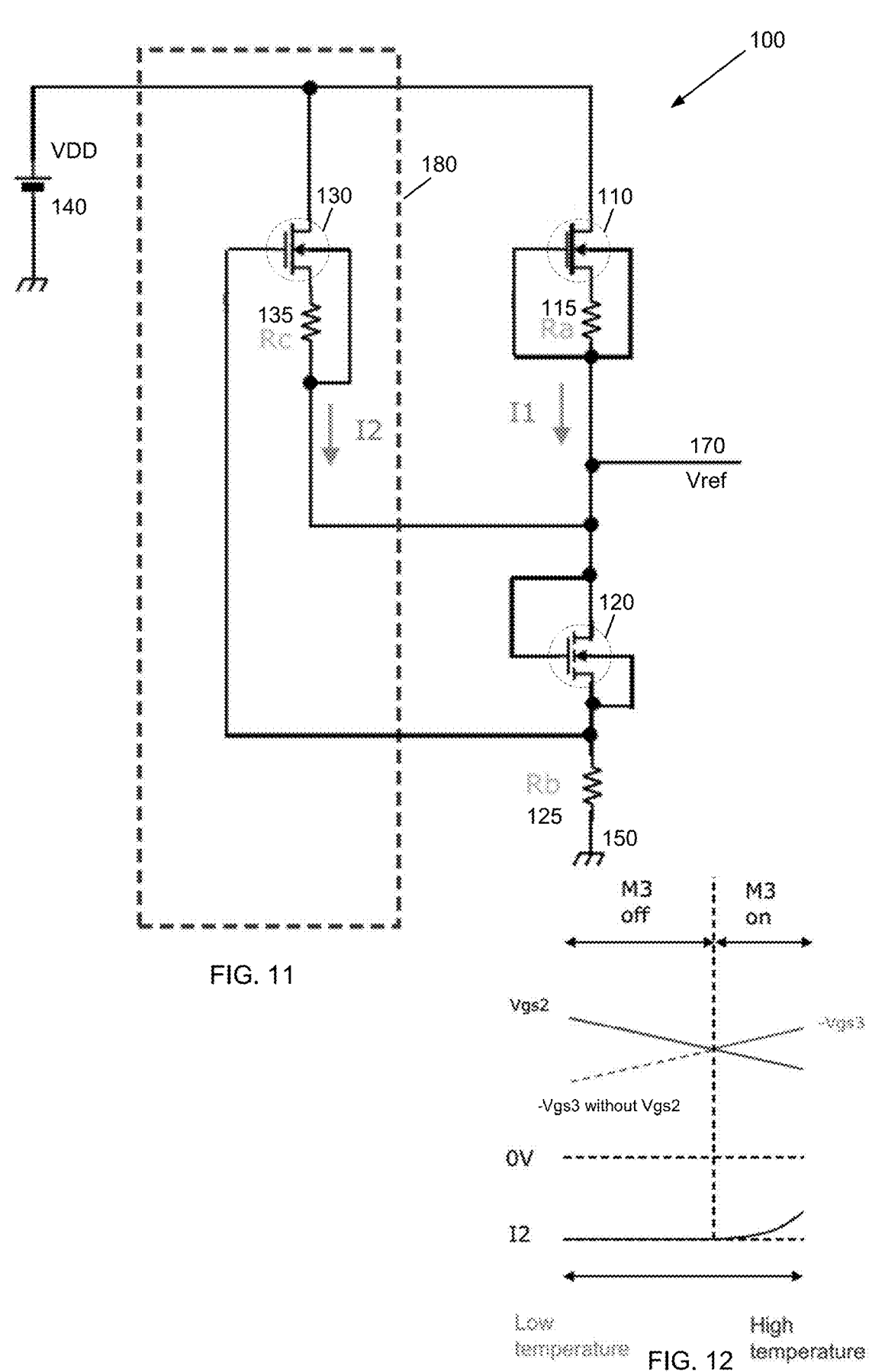
FIG. 11 illustrates schematically an alternative circuit for providing a reference voltage according to an embodiment of the disclosure.
FIG. 12 shows graphs of current provided by an additional depletion type MOSFET, the voltage across the additional depletion type MOSFET, and a generated reference voltage against temperature of the circuit of FIG. 11.

FIG. 11 illustrates schematically an alternative circuit for providing a reference voltage according to an embodiment of the disclosure. Many of the features are the same as those provided in FIG. 4, have similar functionality, and therefore carry the same reference numerals. In this embodiment, the gate of the second depletion-mode MOSFET 130 is connected to the source of the first enhancement-mode MOSFET 120.

The source electrode of the first enhancement-mode nMOSFET 120 is connected to a first reference potential 150. In this example, the first reference potential 150 is a ground potential. The substrate electrode of the first enhancement-mode nMOSFET 120 is connected to the source electrode of the first enhancement-mode nMOSFET 120 at a third node. The third node is formed between the source electrode of the first enhancement-mode nMOSFET 120 and the first reference potential 150.

A second resistor 125 having a resistance Rb is connected in series with the source electrode of the first enhancement-mode nMOSFET 120. The second resistor 125 is formed between the first reference potential 150 and the third node. The gate of the second depletion-mode MOSFET 130 is connected to the source of the first enhancement-mode MOSFET 120 at an eighth node. The eighth node is formed between the third node and the second resistor 125.

The upper portion of FIG. 12 shows the voltage across the second depletion-mode MOSFET 130, Vgs3, and the voltage across the first enhancement-mode nMOSFET 120, Vgs3, against temperature of the circuit 100 of FIG. 11, when M3 is off at lower temperatures and when M3 is on at higher temperatures. If Vgs2>–Vgs3: then M3 is off, and if Vgs2<–Vgs3: then M3 is on, and current I2 generated.

The lower portion of FIG. 12 shows the compensation provided to the generated reference voltage due to the second depletion-mode MOSFET 130 and the current, I2, through the second depletion-mode MOSFET 130.

Figure 13:
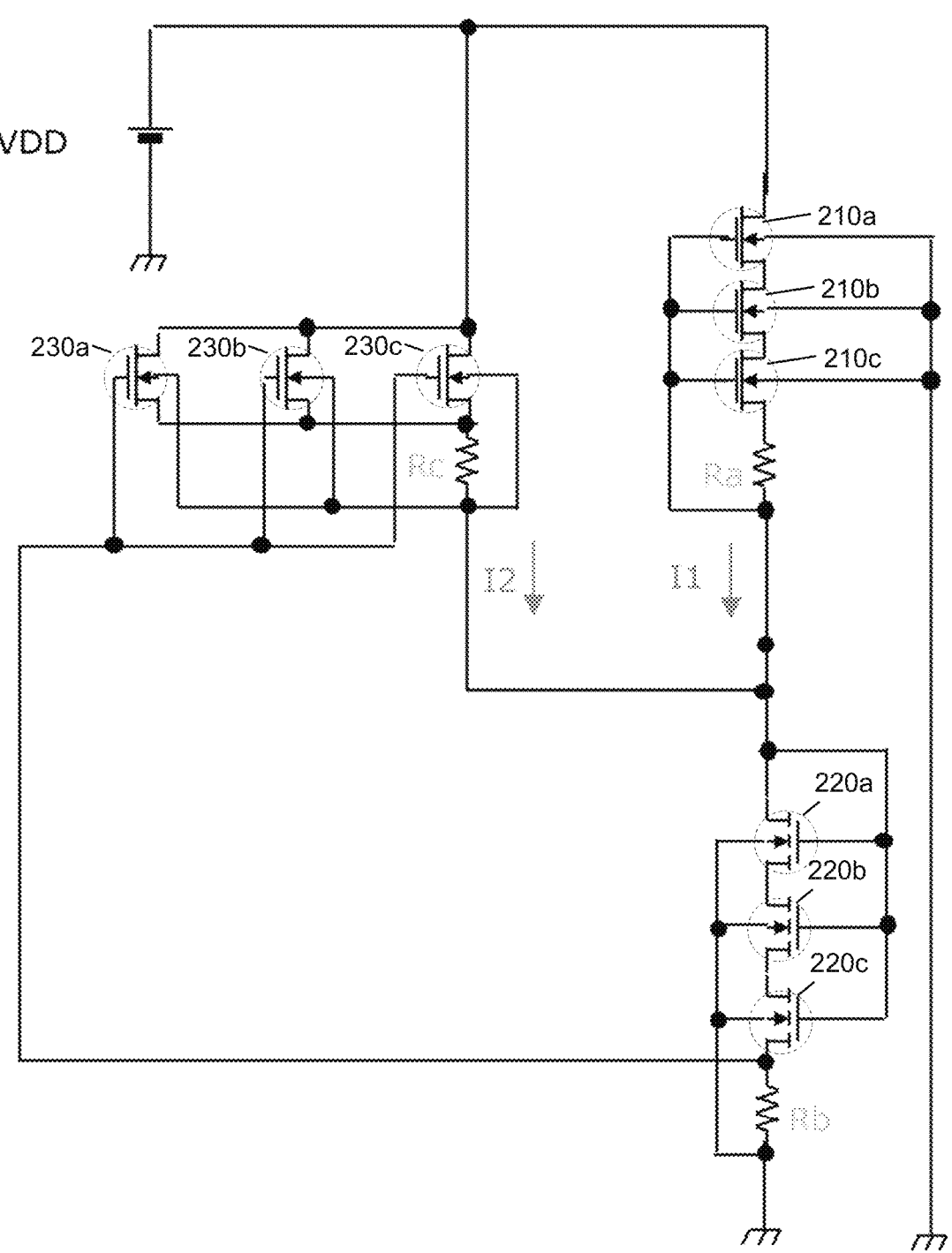
FIG. 13 illustrates schematically an alternative circuit for providing a reference voltage according to an embodiment of the disclosure.

FIG. 13 illustrates schematically an alternative circuit for providing a reference voltage according to an embodiment of the disclosure. This is similar to the circuit shown in FIG. 11. However, in this embodiment, three first depletion-mode MOSFETS 210a, 210b, 210c, are connected in series in place of the one first depletion-mode MOSFET 110 shown in FIG. 11, three first enhancement-mode MOSFETS 220a, 220b, 220c, are connected in series in place of the one first enhancement-mode MOSFET 120 shown in FIG. 11, and three second depletion-mode MOSFETS 230a, 230b, 230c, are connected in parallel in place of the one second depletion-mode MOSFET 130 shown in FIG. 11.

Figure 14:
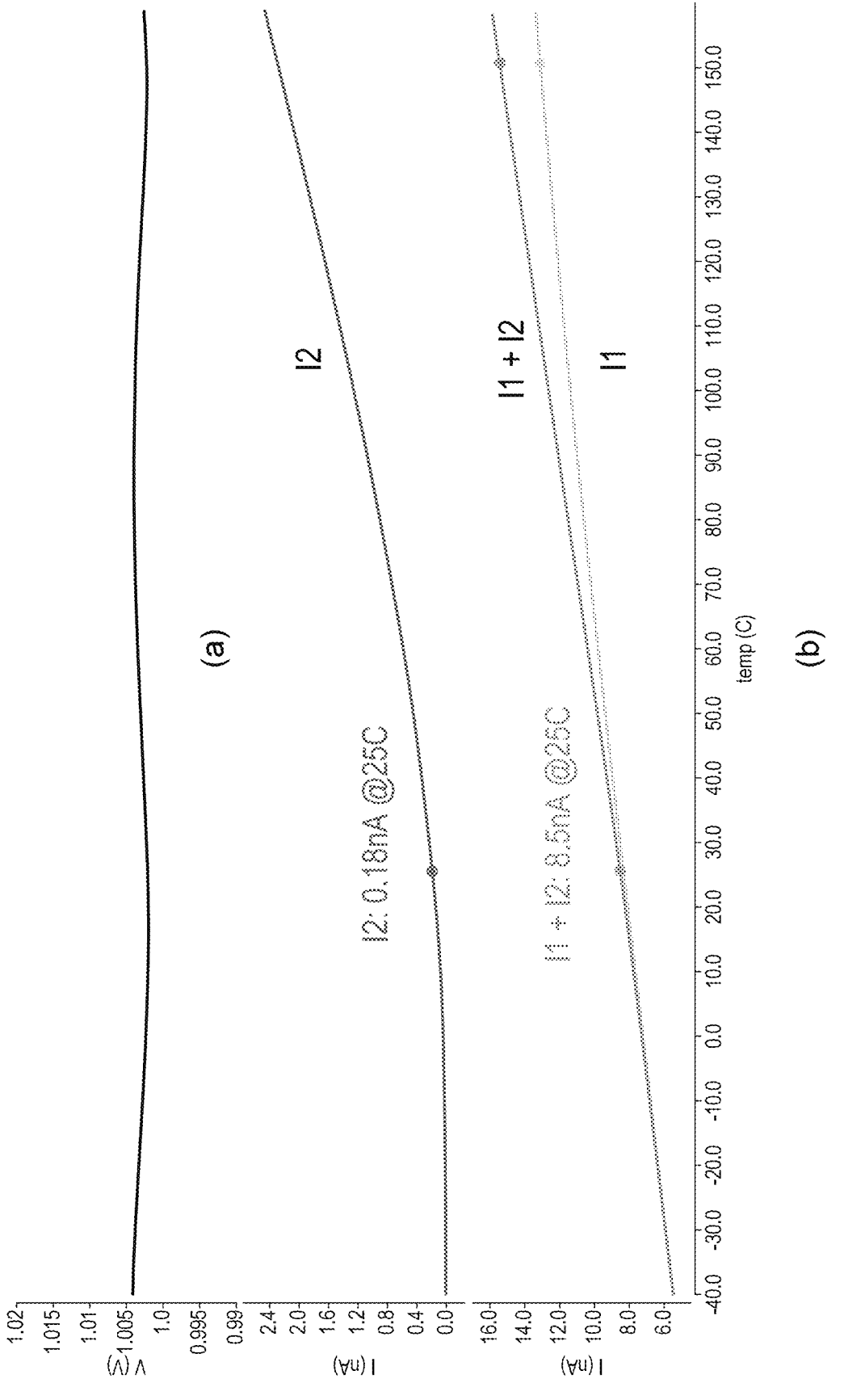
FIG. 14 shows both a graph of simulated values of generated reference voltage against temperature and of current against temperature in the circuit of FIG. 13.

FIG. 14(*a*) shows simulated values of generated reference voltage against temperature for the circuit of FIG. 13, showing Vref against temperature when compensation is provided.

FIG. 14(*b*) shows simulated values of current against temperature for the circuit of FIG. 13. The upper line shows the combined current, I2, from the second depletion-mode MOSFETS 230a, 230b, 230c. The lower line shows the current, I1, through the first depletion-mode MOSFETS 210a, 210b, 210c and the first enhancement-mode MOSFETS 220a, 220b, 220c, and the middle line shows the total current consumption of the circuit, I1+I2.

Figure 15:
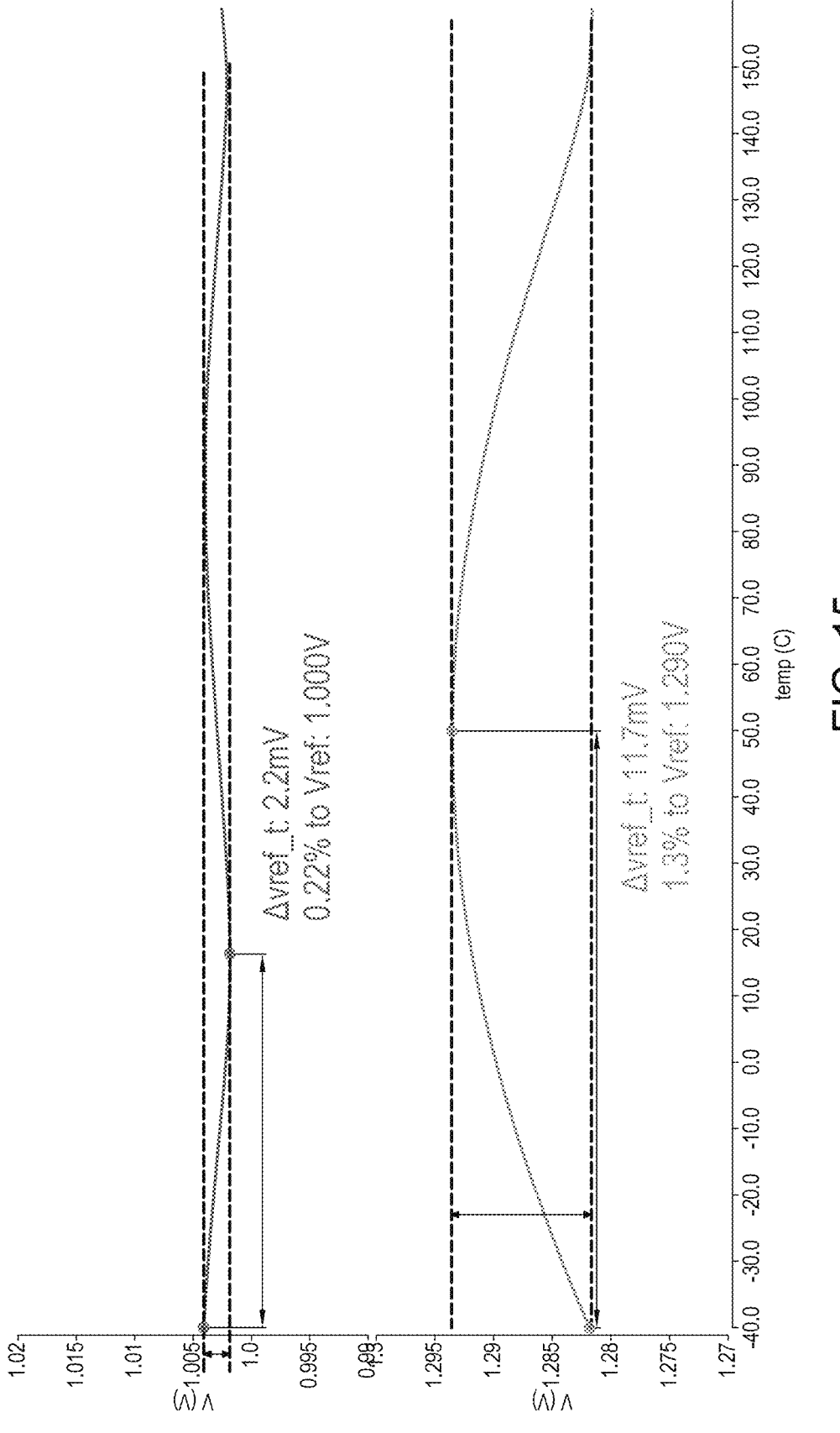
FIG. 15 shows a graph of simulated values of generated reference voltage against temperature of the circuit of FIG. 13.

FIG. 15 shows simulated values of generated reference voltage against temperature of the circuit of FIG. 13, compared to a circuit with no compensation, where the top graph shows simulated values of generated reference voltage against temperature of the circuit of FIG. 13, and the lower graph of FIG. 10 shows generated reference voltage of a circuit with no compensation. This shows the reduced magnitude of Δvref_t due to the compensation, and also the reduced value of Δvref_t as a fraction of Vref itself.

Although specific embodiments have been described above, the claims are not limited to those embodiments. Each feature disclosed herein may be incorporated in any of the described embodiments, alone or in an appropriate combination with other features disclosed herein.

REFERENCE NUMERALS

100 Reference voltage circuit
110 First depletion type MOSFET
115 First resistor
120 Enhancement type MOSFET
125 Second resistor
130 Second depletion type MOSFET
135 Third resistor
140 Power source
150 First reference potential
160 Second reference potential

170 Reference voltage output
180 Additional Circuitry
210a-c First depletion type MOSFET
220a-c Enhancement type MOSFET
230a-c Second depletion type MOSFET

The invention claimed is:

1. A reference voltage generating circuit comprising:
a first depletion type metal-oxide semiconductor field-effect transistor (MOSFET) having a source electrode, a drain electrode, and a gate electrode;
wherein the drain electrode of the first depletion type MOSFET is configured to be connected to a supply potential, and the gate electrode of the first depletion type MOSFET is connected to the source of the first depletion type MOSFET;
a first enhancement type MOSFET having a source electrode, a drain electrode, and a gate electrode, wherein each of the first depletion type MOSFET and the first enhancement type MOSFET comprises a substrate electrode; and
wherein the drain electrode of the first enhancement type MOSFET is connected to the source electrode of the first depletion type MOSFET, the gate electrode of the first enhancement type MOSFET is connected to the drain of the first enhancement type MOSFET, and the source electrode of the first enhancement type MOSFET is connected to a first reference potential;
a reference voltage output connected between the source electrode of the first depletion type MOSFET and the drain electrode of the first enhancement type MOSFET;
a second depletion type MOSFET having a source electrode, a drain electrode, and a gate electrode;
a first resistor connected between the source of the first depletion type MOSFET and the substrate electrode of the first depletion type MOSFET; and
a second resistor connected between the source of the first enhancement type MOSFET and the substrate electrode of the first enhancement type MOSFET;
wherein the drain electrode of the second depletion type MOSFET is connected between the supply potential and the drain electrode of the first depletion type MOSFET, and the source electrode of the second depletion type MOSFET is connected between the source electrode of the first depletion type MOSFET and the drain electrode of the first enhancement type MOSFET;
wherein the first resistor has a resistance, and the second resistor has a resistance that have a ratio that is configured so that a voltage of the reference voltage output decreases with increasing temperature;
wherein the gate electrode of the second depletion type MOSFET is connected to a second reference potential; and
wherein the first reference potential and the second reference potential are the same.

2. The reference voltage generating circuit according to claim 1, wherein each of the first depletion type MOSFET and the first enhancement type MOSFET comprise N-channel MOSFETs.

3. The reference voltage generating circuit according to claim 1, wherein the resistance of the first resistor is less than the resistance of the second resistor.

4. The reference voltage generating circuit according to claim 1, wherein the second depletion type MOSFET comprises a substrate electrode.

5. The reference voltage generating circuit according to claim 2, wherein the second depletion type MOSFET comprises a substrate electrode.

6. The reference voltage generating circuit according to claim 3, wherein the second depletion type MOSFET comprises a substrate electrode.

7. The reference voltage generating circuit according to claim 4, wherein the second depletion type MOSFET comprises an N-channel MOSFET.

8. The reference voltage generating circuit according to claim 4, further comprising a third resistor connected between the source of the second depletion type MOSFET and the substrate electrode of the second depletion type MOSFET.

9. The reference voltage generating circuit according to claim 7, further comprising a third resistor connected between the source of the second depletion type MOSFET and the substrate electrode of the second depletion type MOSFET.

10. The reference voltage generating circuit according to claim 1, wherein the first reference potential and/or the second reference potential are ground potential.

11. The reference voltage generating circuit according to claim 1, wherein the gate of the second depletion type MOSFET is connected to the source of the first enhancement type MOSFET.

12. The reference voltage generating circuit according to claim 1, wherein the source of the second depletion type MOSFET is connected between the drain of the first enhancement type MOSFET and the reference voltage output.

13. The reference voltage generating circuit according to claim 1, further comprising:

one or more additional first depletion type MOSFETs connected in series with the first depletion type MOS-FET;

one or more additional first enhancement type MOSFETs connected in series with the first enhancement type MOSFET; and one or more additional second depletion type MOSFETs connected in parallel with the second depletion type MOSFET.

14. A method of manufacturing a reference voltage generating circuit, the method comprising the steps of:

forming a first depletion type metal-oxide semiconductor field-effect transistor (MOSFET) having a source electrode, a drain electrode, and a gate electrode; and wherein the drain electrode of the first depletion type MOSFET is configured to be connected to a supply potential, and the gate electrode of the first depletion type MOSFET is connected to the source of the first depletion type MOSFET;

forming a first enhancement type MOSFET having a source electrode, a drain electrode, and a gate electrode, wherein each of the first depletion type MOSFET and the first enhancement type MOSFET comprises a substrate electrode;

wherein the drain electrode of the first enhancement type MOSFET is connected to the source electrode of the first depletion type MOSFET, the gate electrode of the first enhancement type MOSFET is connected to the drain of the first enhancement type MOSFET, and the source electrode of the first enhancement type MOS-FET is connected to a first reference potential;

forming a reference voltage output connected between the source electrode of the first depletion type MOSFET and the drain electrode of the first enhancement type MOSFET;

a second depletion type MOSFET having a source electrode, a drain electrode, and a gate electrode;

forming a first resistor connected between the source of the first depletion type MOSFET and the substrate electrode of the first depletion type MOSFET; and forming a second resistor connected between the source of the first enhancement type MOSFET and the substrate electrode of the first enhancement type MOSFET;

wherein the drain electrode of the second depletion type MOSFET is connected between the supply potential and the drain electrode of the first depletion type MOSFET, and the source electrode of the second depletion type MOSFET is connected between the source electrode of the first depletion type MOSFET and the drain electrode of the first enhancement type MOSFET;

wherein the first resistor has a resistance and the second resistor has a resistance, that has a ratio that is configured so that a voltage of the reference voltage output decreases with increasing temperature;

wherein the gate electrode of the second depletion type MOSFET is connected to a second reference potential; and wherein the first reference potential and the second reference potential are the same reference potential.

* * * * *